United States Patent
Broeckmann et al.

(10) Patent No.: US 9,632,131 B2
(45) Date of Patent: Apr. 25, 2017

(54) METHOD FOR MONITORING AND MEASURING AN INSULATION RESISTANCE WITH INTERFERENCE-RESISTANT MEASURING SIGNAL

(71) Applicant: Bender GmbH & Co. KG, Gruenberg (DE)

(72) Inventors: Eckhard Broeckmann, Buseck (DE); Burkhard Macht, Hungen (DE); Dieter Hackl, Fernwald (DE)

(73) Assignee: BENDER GMBH & CO. KG, Gruenberg (DE)

( * ) Notice: Subject to any disclaimer, the term of this patent is extended or adjusted under 35 U.S.C. 154(b) by 706 days.

(21) Appl. No.: 14/038,914

(22) Filed: Sep. 27, 2013

(65) Prior Publication Data

US 2014/0114591 A1 Apr. 24, 2014

(30) Foreign Application Priority Data

Oct. 4, 2012 (DE) ........................ 10 2012 218 107

(51) Int. Cl.
*G01R 31/12* (2006.01)
*G01R 27/02* (2006.01)
(Continued)

(52) U.S. Cl.
CPC ....... *G01R 31/1272* (2013.01); *G01R 27/025* (2013.01); *G01R 27/18* (2013.01); *H02H 5/105* (2013.01)

(58) Field of Classification Search
CPC .................................................. G01R 31/1272
(Continued)

(56) References Cited

U.S. PATENT DOCUMENTS

| 4,472,676 A | 9/1984 | Eichmann et al. |
| 4,896,115 A | 1/1990 | LeMaitre et al. |

(Continued)

FOREIGN PATENT DOCUMENTS

| CN | 1419136 A | 5/2003 |
| CN | 1834673 A | 9/2006 |

(Continued)

OTHER PUBLICATIONS

State Intellectual Property Office of People's Republic of China, First Office Action and Search Report, Application No. 201310456410.2, Oct. 27, 2015.

(Continued)

*Primary Examiner* — Bryan Bui
(74) *Attorney, Agent, or Firm* — Quarles & Brady LLP

(57) ABSTRACT

A method for monitoring and measuring an insulation resistance in ungrounded and grounded power supply systems includes the method steps of generating a periodic measuring signal, coupling in the measuring signal between active conductors of the power supply system to be monitored and ground, and detecting and evaluating measured values of the measuring signal. In one embodiment of the invention, the generated measuring signal is formed as a multi-frequency signal by the superposition of a finite number of harmonic oscillations with at least three harmonics. Alternatively, the multi-frequency signal can also be realized by means of a targeted, portioned construction of the signal shape in the time domain on the basis of a binary sequence optimization or by generating the measuring signal by means of the time-division multiplexing method.

16 Claims, 15 Drawing Sheets

(51) Int. Cl.
*G01R 27/18* (2006.01)
*H02H 5/10* (2006.01)

(58) Field of Classification Search
USPC .......................................................... 702/58
See application file for complete search history.

(56) References Cited

U.S. PATENT DOCUMENTS

| | | | |
|---|---|---|---|
| 9,069,025 B2* | 6/2015 | Schaefer | G01R 27/025 |
| 2011/0085272 A1 | 4/2011 | Schweitzer, III et al. | |

FOREIGN PATENT DOCUMENTS

| | | |
|---|---|---|
| CN | 102200555 A | 9/2011 |
| DE | 1023818 B | 2/1958 |
| DE | 3112952 C2 | 9/1984 |
| DE | 3882833 T2 | 1/1990 |
| EP | 0593007 B1 | 3/2005 |
| JP | H04309870 A | 11/1992 |
| WO | 9525963 | 9/1995 |
| WO | 2007054700 A1 | 5/2007 |

OTHER PUBLICATIONS

Min, et al., Binary Signals in Impedance Spectroscopy, Engineering in Medicine and Biology Society (EMBS), 2012 Annual International Conference of the IEEE, 2012, pp. 134-137.
Schoukens, et al., Survey of Excitation Signals for FFT Based Signal Analyzers, IEEE Transactions on Instrumentation and Measurement, 1988, 37(3):342-352.
Schroeder, Synthesis of Low-Peak-Factor Signals and Binary Sequences With Low Autocorrelation, IEEE Transactions on Information Theory, 1970, 16(1):85-89.
Van Der Ouderaa, et al., Peak Factor Minimization of Input and Output Signals of Linear Systems, IEEE Transactions on Instrumentation and Measurement, 1988, 37(2):207-212.
European Patent Office, Search Report, Application No. 13184524.0, Feb. 7, 2014, 9 pages.

* cited by examiner

METHOD FOR MONITORING AND MEASURING AN INSULATION RESISTANCE WITH INTERFERENCE-RESISTANT MEASURING SIGNAL

CROSS REFERENCE TO RELATED APPLICATION

This application claims the priority benefit of German Patent Application No. 10 2012 218 107.5 filed on Oct. 4, 2012, which is fully incorporated herein by reference.

STATEMENT REGARDING FEDERALLY SPONSORED RESEARCH OR DEVELOPMENT

Not applicable.

FIELD OF THE INVENTION

The invention relates to a method for monitoring and measuring an insulation resistance in ungrounded and grounded power supply systems, comprising the method steps of: generating a periodic measuring signal, coupling in the measuring signal between active conductors of the power supply system to be monitored and ground, and detecting and evaluating measured values of the measuring signal.

Further, the invention relates to a signal generator for monitoring an insulation resistance in ungrounded and grounded power supply systems, comprising a signal generator circuit for generating a periodic measuring signal, and comprising a coupling circuit for coupling in the measuring signal between active conductors of the power supply system to be monitored and ground.

BACKGROUND OF THE INVENTION

With regard to personnel, system and fire safety in electric power supply systems and equipment, the monitoring of the insulation resistance, i.e. the resistance in the power supply system to be monitored including the resistances of all equipment connected thereto against ground, is an indispensible prerequisite for a failure-free operation of the electric system. Without a sufficiently high insulation resistance, protection against direct and indirect contact is no longer ensured. Malfunctions of the electric systems may cause danger to personnel, lead to loss of production or to a halt of the system, or short-circuit currents or ground fault currents can cause fires and explosions. In newly assembled systems and equipment, the insulation resistance is usually high enough, but over the course of operation of the system it can be decreased by electrical and mechanical influences and by environmental influences and the effects of age.

A measurement of the insulation resistance can be carried out in grounded networks (TN systems) as well as in ungrounded networks (IT systems), the constant monitoring of the absolute insulation value during operation playing a prominent role. For the measurement, independently from the type of network, a signal generator and a measuring device are interposed between the active conductors of a power supply system and ground, the signal generator impressing a measuring signal voltage into the network so that in the case of an insulation fault a closed circuit is formed in which a measuring current proportional to the insulation fault sets in. Said measuring current is registered by the measuring device and thus allows a statement concerning the strength of the insulation resistance.

In today's modern networks, a plurality of the equipment is provided with electronic components. In order to prevent measurement distortions, caused for example by direct current components generated by inverters, the measuring methods have been constantly developed further in view of a reliable insulation monitoring. Hence, it is known practice to use the method of superimposing a DC measuring voltage in pure alternating current networks without distorting direct current components, whereas in faulty environments a controlled, specifically clocked measuring voltage with square-shaped generator pulse forms is employed. Square pulse sequences of this sort used in monitoring devices currently on the market prove to be relatively insensitive to broad-band interference signals, but they show an insufficient robustness in case of narrow-band interferences.

From DE 38 82 833 T2, it is further known to supply an AC voltage reference signal on the basis of which the real and imaginary part of a complex insulation impedance can be calculated via a suitable evaluation circuit. Since the sinusoidal reference signal has only one frequency component, it is relatively sensitive to interference signals that occur in the range of the frequency of the reference signal.

In order to be able to better deal with low-frequency interferences, in EP 0 593 007 B1, the calculation of the complex-valued network leakage impedance on the basis of two periodic measuring signal alternating voltages with constant amplitudes is proposed. However, the frequencies of the two alternating voltages should lie in a range largely free of interference signals and be relatively low for the network leakage values to be calculable, neglecting the network inductivities, by a simplified function correlation.

The methods known from the state of the art for determining the insulation resistance provide insufficient interference resistance against narrow-band interference signals, in particular against interference signals with only one discrete frequency. Moreover, the measuring signals used are tied to evaluation methods that are adjusted to the respective measuring signal form and show different efficiencies with regard to the suppression of interference signals. All in all, the problem of interference suppression has been unsatisfactorily solved thus far.

SUMMARY OF THE INVENTION

Therefore, it is the object of the present invention to develop a method and a device for monitoring and measuring an insulation resistance that has an increased interference resistance against interference signals, in particular against narrow-band interference signals.

With regard to a method, said object is achieved in connection with the preamble of claim 1 in that the generated measuring signal is formed as a multi-frequency signal by the superposition of a finite number of harmonic oscillations with at least three harmonics.

Simulations of faulty power supply systems have shown that certain types of interference signals, such as oscillations, caused by other electric systems and equipment connected to the network, can be successfully suppressed if the frequency spectrum of the generated periodic measuring signal is composed of few discrete components, i.e. if it is composed of a Fourier series with a finite number of Fourier components. In the following, this feature is called "multi-frequency". Since only periodic measuring signals are described here and a periodic signal always has a line spectrum (frequency-discrete spectrum), the term "spectrum" shall be considered to describe the Fourier coefficients of the harmonics, the first harmonic or the harmonic of first order corresponding to the harmonic oscillation with the fundamental frequency (generator frequency) $f_{gen}$ and the $n^{th}$ harmonic or harmonic of $n^{th}$ order having the frequency $nf_{gen}$.

The use of a multi-frequency signal of this sort that is formed by a finite number of harmonic oscillations—usually by a sine signal of a fundamental frequency and the harmonic thereof—has the advantage that interfering oscillations are effectively suppressed because they can only affect a single component of the Fourier spectrum. The remaining undisturbed Fourier coefficients still allow a majority decision on the correct value of the insulation impedance if the measuring signal is formed according to the invention by at least three superimposed oscillations (harmonics). Thus, the measuring signal $U_{gen}$ (generator voltage) can be represented as $$U_{gen}(t) = \sum_{n=1}^{N} \cos(2\pi n f_{gen} t) \quad (1)$$

wherein $f_{gen}$: fundamental generator frequency, n: order of the harmonic.

The period duration of the fundamental generator frequency thus results in $T_{gen}=1/f_{gen}$. The Fourier coefficients belonging to equation (1) are real-valued with the absolute value 1.

In an advantageous embodiment of the method, the ratio of the peak value to the root mean square of the measuring signal is minimized.

The measuring signal described in equation (1) is easily generated and compared to the square pulse sequences known from the state of the art, it exhibits an improved interference-resistance against narrow-band interference signals. This resistance, however, can be further increased if the root mean squares and the power of superimposed sine signals are optimized within given modulation limits of the generator to the effect that a maximally possible signal-to-noise ratio (SNR) is pursued. At a given interference signal power, this procedure is equivalent to a maximization of the measuring signal power (useful signal power) and thus corresponds to a minimization of the ratio of the peak value to the root mean square (peak factor, crest factor) of the measuring signal.

Preferably, the minimization of the ratio of the peak value to the root mean square of the measuring signal takes place by means of a phase optimization.

The frequencies of the selected harmonics remain unchanged in an advantageous manner during a phase optimization; only their phases are shifted against one another so that the crest factor reaches a minimum or at least becomes as small as possible. Complex-valued Fourier coefficients are the result of the time (phase) shift while the amplitude spectrum is invariant.

Advantageously, the phase optimization takes place according to the Schroeder-phase equation $$\varphi_n = \frac{\pi n(n-1)}{N}, \quad (2)$$

wherein $\phi_n$ is the phase of the harmonic of $n^{th}$ order and N is the number of harmonics.

This phase optimization according to M. R. Schroeder (1970), known from acoustics, can be computationally applied in a simple manner to the finite number of harmonic measuring signal components and thus a crest factor as small as possible can be achieved.

Inserted into equation (1), the Schroeder-phase equation (2) results in the measuring signal $$U_{gen}(t) = \sum_{n=1}^{N} \cos\left(\frac{\pi n(n-1)}{N} + 2\pi n f_{gen} t\right) \quad (3)$$

with complex-valued Fourier coefficients whose absolute values equal 1.

In a further, alternative embodiment, the phase optimization takes place in that measuring signal forms with incremental phase variations of the harmonics are calculated.

By means of a calculation program, the phases of the individual harmonics are incrementally varied until an acceptable minimum of the crest factor is found. The measuring signal generated with this phase optimization by phase variation then is $$U_{gen}(t) = \sum_{n=1}^{N} \cos(\varphi_{n,v} + 2\pi n f_{gen} t), \quad (4)$$

wherein $\phi_{n,v}$ are the phases of the individual harmonics after the phase variation.

Both afore-mentioned optimization methods thus aim at achieving a signal-to-noise ratio as high as possible by minimizing the crest factor. In case of a small number of harmonics, the method of phase variation does not require a long calculating time and provides the smallest crest factor. In case of a very large number of harmonics, however, the phase optimization according to Schroeder appears to be the more efficient method.

In an advantageous embodiment of the method, the amplitudes of the harmonics rise monotonically with the frequency.

The phase optimization according to the Schroeder-phase equation (2) assumes equally large amplitude values for each harmonic. However, since the harmonics of higher order are damped more strongly than the fundamental frequency owing to the capacitive load (leakage capacity) of the insulation impedance, an amplitude increase of the individual measuring signal components that rises with the frequency is sensible when generating the measuring signal in order to ensure a sufficient signal-to-noise ratio even for the highest desired harmonic. Thus, in equation (4), the amplitude factor $a_n$ is additionally introduced:

$$U_{gen}(t) = \sum_{n=1}^{N} a_n \cos(\varphi_{n,v} + 2\pi n f_{gen} t), \quad (5)$$

wherein the absolute values of the complex-valued Fourier coefficients are given by the coefficients $a_n$. The low-pass effect of the complex-valued insulation impedance can thus be effectively counteracted.

Preferably, the amplitude increase is implemented in such a manner that the amplitudes of the harmonics rise linearly with the frequency. Calculations have shown that a simple linear relation of the amplitude factors $a_n$ via the frequency is sufficient in practice so that the increase of the amplitude factors $a_n$ as a function of the order n of the harmonics can be expressed as:

$$a_n = a_1 + b(n-1) \qquad (6)$$

Good results are achieved with a gradient b in the range of 0.5 to 1. Also, in this case, the phase optimization can be performed according to the method of phase variation until a minimum of the crest factor is found.

To maximize the power of selected harmonics, a controlled overmodulation of the measuring signal can further take place in that a limitation and/or an amplification factor and/or a DC offset can be set.

If EMC phenomena are not a factor and the evaluation method can also tolerate undesired harmonics, i.e. non-used harmonics—in contrast to the selected harmonics usable for evaluation—, a further increase of the power of the harmonics is possible via a controlled overmodulation of the multi-frequency signal. In this context, the amplification factor and/or a DC offset can be set as parameters of the overmodulation within of a signal amplitude (dynamic range) predefined by a limitation. Due to a rising amplification factor, the edge steepness—and thus the level of higher harmonics—increases. In addition, an optional DC offset can produce an even higher gain of power of the individual harmonics, as a result of which more room for amplitudes of the harmonics can be created within the dynamic range. The change of the two parameters amplification factor and DC offset provide the possibility to effect a maximization of the power of the harmonics while observing the changing resulting spectrum.

By the transition of the controlled overmodulation to an extreme overmodulation, a square pulse sequence can be generated in such a manner that the power of selected harmonics becomes maximal in a predefined dynamic range.

If the amplification factor is increased to such an extent that the signal at almost infinite edge steepness becomes a square signal, the power of the selected harmonics can become maximal in a predefined dynamic range.

Further, the task is solved relating to a method in connection with the preamble of claim 10 in that the generated measuring signal is constructed as a multi-frequency signal by a square pulse sequence, a square pulse forming the sequence being divided into m portions of equal length, the m portions being binarily set, in an ordered manner, in a unipolar manner to 0/1 or in a bipolar manner to −1/+1, Fourier coefficients for selected harmonics being calculated for each of the $2^m$ possible square pulse sequences, and the square pulse sequence being selected that fulfils the predefined requirements regarding its spectral composition.

As an alternative to the afore-mentioned method, the multi-frequency signal can also take place by means of a targeted portioned construction of the signal form in the time domain so as to fulfil specific requirements regarding the composition in the spectral range. The starting point is a binary sequence optimization in which the square pulse having the duration $T_{gen}$ and forming the square pulse sequence is first divided into m portions, which portions are then associated with the possible binary combinations and the respective spectral composition of the resulting $2^m$ signal courses is evaluated. The sequence is selected whose Fourier coefficients meet the predefined requirements at the interesting frequency points within permitted tolerances.

According to the greater development objective of generating an interference-resistant measuring signal, criteria imposed on the amplitude distribution of the Fourier coefficients may include requirements such as the power of selected harmonics becoming maximal in a predefined dynamic range, low harmonics of a fundamental frequency being suppressed, the amplitudes of the harmonics rising monotonically with the frequency and/or the amplitudes of the harmonics rising linearly with the frequency.

In a further embodiment, the edges of the square pulse sequence can be post-processed by inserting interpolating nodes, resulting in a signal form that deviates from the square pulse.

In case of a nonexistent or very low leakage capacity, square pulse sequences may overexert the electronic components of the measuring arrangement with regard to the transmission bandwidth. For example, in case of a delta-sigma analog-to-digital converter, sampling errors occur in steep edges of the input signal, or operational amplifiers cause errors due to their limited edge steepness (slew rate). One solution thus lies in modifying the generated square pulse sequences by inserting interpolating nodes into the signal course. This results in a signal form that deviates from the square pulse and has a more favourable, band-limited spectral profile.

Preferably, trapezoidal pulse sequences are generated by means of linearly interpolating nodes.

These sequences have limited edge steepness and thus relieve the strain on the electronic components. The generator period $T_{gen}$ is divided into even finer time periods and the sample values of the generator voltage $U_{gen}$ are—in bipolar display—not only set to −1 or to +1 but also linearly interpolating nodes are additionally inserted between the −1/+1 alternations, i.e. in the edge area. If only one additional node is possible, a zero will be inserted; if, for example, three additional nodes are possible, −½, 0, ½ or ½, 0, −½ will be inserted, respectively. As a consequence of the less steep level transitions, the share of higher harmonics decreases. If higher harmonics not used for evaluation are still interfering, the number of possible interpolating nodes between the +1/−1 alternations can be increased further.

In another embodiment, pulses with cosine edges or with largely linearly running edges and rounded transitions to the constant portions can be generated by means of the interpolating nodes.

Inserting linearly interpolating nodes leads to a trapezoidal shape of the measuring signal; hence, it still comprises sharp-edged transitions, corresponding to high frequency portions, in the temporal course. Another weakening of higher harmonics towards an overall band-limited measuring signal can be achieved by replacing the linear edges with cosine-shaped edges. An intermediate form with largely linearly running edges and rounded transitions to constant portions also leads to a weakening of the higher harmonics due to the less sharp-edged signal profile. In some evaluating methods, this edge shape can improve the resolution of very small time constants of the insulation impedance and is used if it is desired to limit the maximal rate of increase. In this context it has been found that the rounding ranges should be relatively small because otherwise power of the highest useful harmonics is again lost.

Further, the object is achieved with regard to a method for monitoring and measuring an insulation resistance in ungrounded and grounded power supply systems in that the generated measuring signal is formed as a multi-frequency signal within a measuring signal period by temporally subsequent and continuously merging signal portions that are allocated with functions of different, selected order of an orthogonal function system.

If in principle an evaluation period is assumed in which the evaluation extends over more than one generator period, the individual harmonics can be generated in a temporally subsequent manner by means of the time-division multiplexing method. There, a measuring signal period (repetitive period of the measuring signal—corresponds to the evaluation period) is composed of multiple signal portions whose number corresponds to the number of selected harmonics and which, continuously merging, are allocated with functions of the selected orders of an orthogonal function system. The different $n^{th}$ orders represent the different $n^{th}$ harmonics and thus allow a targeted spectral composition of the multi-frequency signal. Additionally, exploiting the temporal orthogonality, functions of the same order can also be included, e.g. sine and cosine functions of the same frequency, so as to be able to determine the complex-valued insulation impedance by evaluating the real and imaginary part.

Preferably, the functions are sinusoidal functions and their harmonics. Sinusoidal functions are convenient as a simple implementation of fundamental functions of an orthogonal function system.

In these functions, an overmodulation and/or a limitation of the signal portions can take place in order to increase the root mean square of higher harmonics.

Alternatively, the functions can also be square functions, Walsh functions, trapezoidal functions or functions with cosine edges.

The functions of the orthogonal Walsh function system are particularly suited for determining the real and imaginary part of the insulation impedance by means of a corresponding evaluation method, whereas functions with cosine edges are characterized by good spectral properties in terms of a bandwidth limitation.

The trapezoidal functions can have largely linearly running edges and rounded transitions to constant portions and thus already possess the afore-described advantages of a weakening of the undesired higher harmonics.

If the evaluation period extends over a multiple of the generator period, the signal portions preferably have the same length. If, for example, the first, second and third harmonic of a fundamental frequency are generated in a temporally subsequent manner, it is sensible to make every signal portion have the same length as the length of a generator period so that, for example, the repetitive period of the multi-frequency measuring signal is triple the generator period or, respectively, the repetitive frequency of the measuring signal is triple the fundamental frequency.

If the evaluating period is not limited to integer multiples of the generator period, a weighting of the functions can take place by means of differently long signal portions. The individual signal portions, during which the functions of different order are presented, do no longer correspond to exactly one generator period and have different lengths. By selecting the length ratios, a relative weighting in favour of desired, selected harmonics can be achieved.

With regard to a device, the object is achieved by a signal generator for monitoring an insulation resistance in ungrounded and grounded power supply systems, comprising a signal generator circuit for generating a periodic measuring signal and comprising a coupling circuit for coupling in the measuring signal between active conductors of the power supply system to be monitored and ground, the signal generator circuit comprising means for generating and storing the multi-frequency measuring signals generated by means of at least one of the methods of the invention disclosed herein.

BRIEF DESCRIPTION OF THE DRAWINGS

Other advantageous design features arise from the following description and the drawing, which illustrate preferred embodiments of the invention with the aid of examples.

DETAILED DESCRIPTION OF THE EXAMPLE EMBODIMENTS

Figure 1:
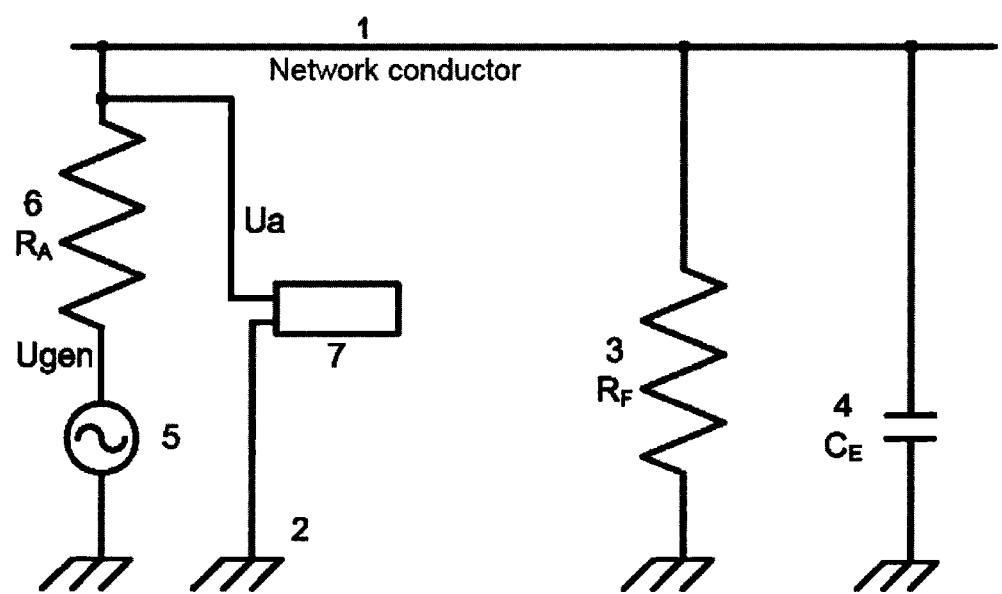
FIG. 1 schematically shows a power supply system with a signal generator and a measuring device.

In a schematic illustration, FIG. 1 shows a network conductor 1 of a power supply system, which is connected to the ground potential 2 via a (faulty) insulation resistance $R_F$ 3 and a leakage capacity $C_E$ 4. A signal generator circuit 5 of a monitoring device, for example an insulation monitoring apparatus, generates a measuring signal $U_{gen}$ (generator voltage) which is supplied to the network conductor 1 via a coupling resistance $R_A$ 6. In principle, it is also possible to couple in a current signal instead of a measuring voltage as a measuring signal, wherein then the coupling resistance $R_A$ can be omitted. Measured values of the measuring signal on the network conductor are registered by a measuring circuit 7 and used in a subsequent evaluation device to calculate the insulation resistance $R_F$ 3 and the leakage capacity $C_E$ 4.

Figure 2:
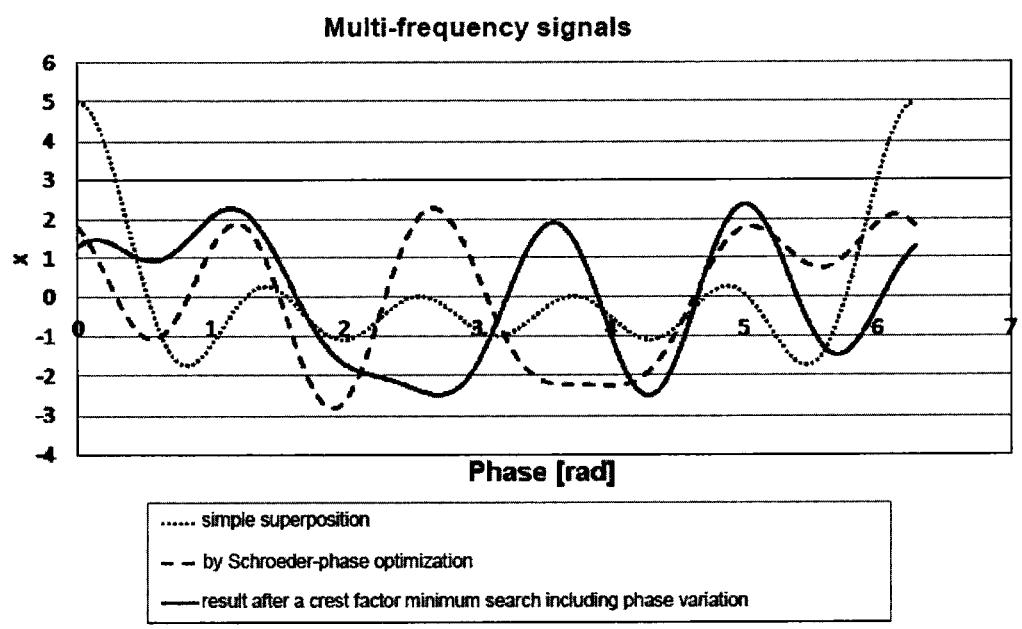
FIG. 2 shows a multi-frequency signal according to the invention.

In FIG. 2, a multi-frequency signal according to the invention is illustrated. Starting from a simple superposition according to equation (1) (dotted line), FIG. 2 shows a superposition according to the Schroeder-phase optimization according to equation (3) (dashed line) and the result of a crest factor minimization following a phase optimization by phase variation according to equation (4) (continuous line). Both phase-optimized methods have noticeably smaller extreme values in the amplitude profile, the latter curve leading to the smaller extreme values.

Figure 3A:
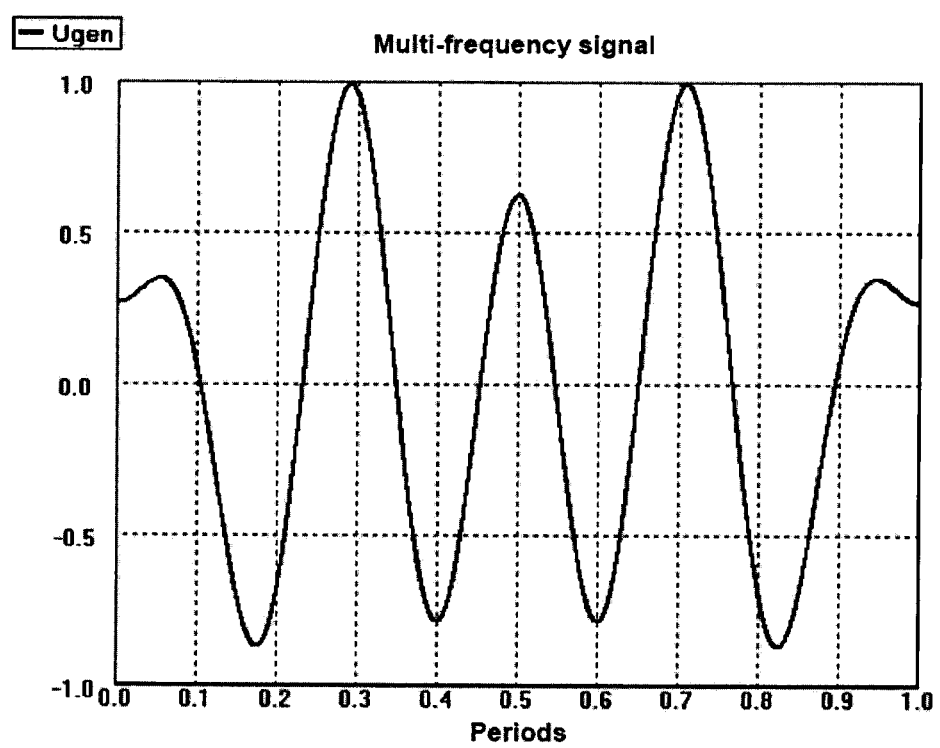
FIG. 3a, 3b show a multi-frequency signal after phase optimization with a spectrum.
Figure 3B:
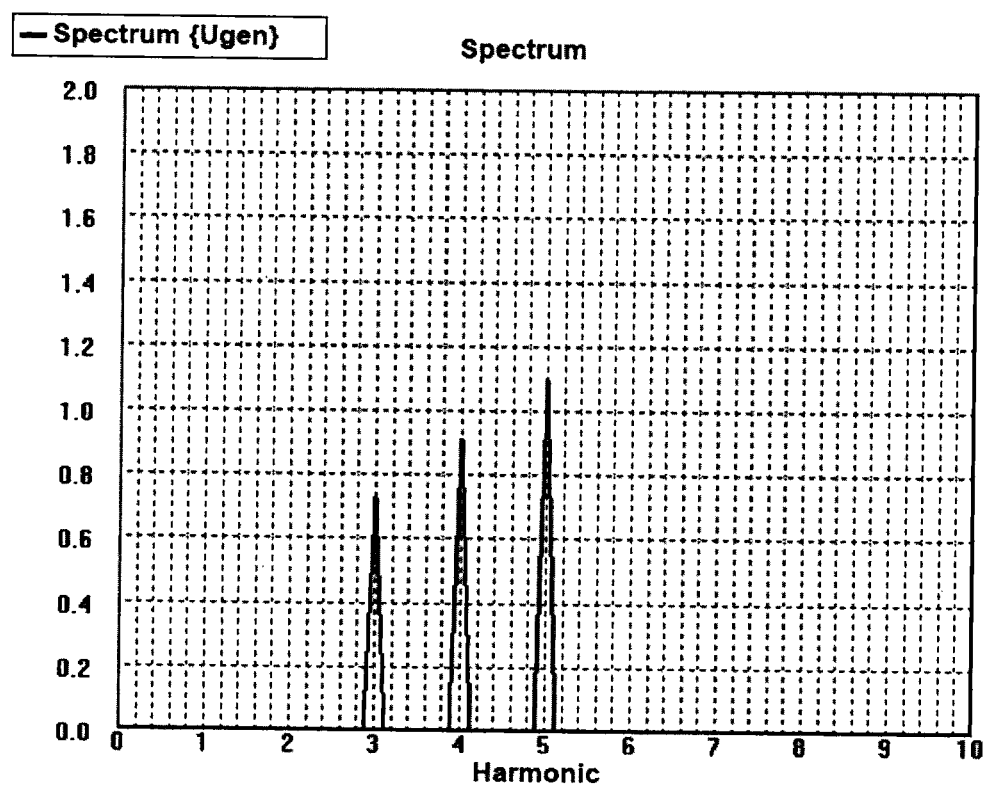

FIGS. 3a and 3b show a multi-frequency signal after a phase optimization with the associated spectrum. The multi-frequency signal is composed of three frequencies, namely of the $3^{rd}$, $4^{th}$ and $5^{th}$ harmonic of a fundamental frequency, and it is modulated in a manner resulting in a frequency-linear increase of the amplitude factor.

Figure 4A:
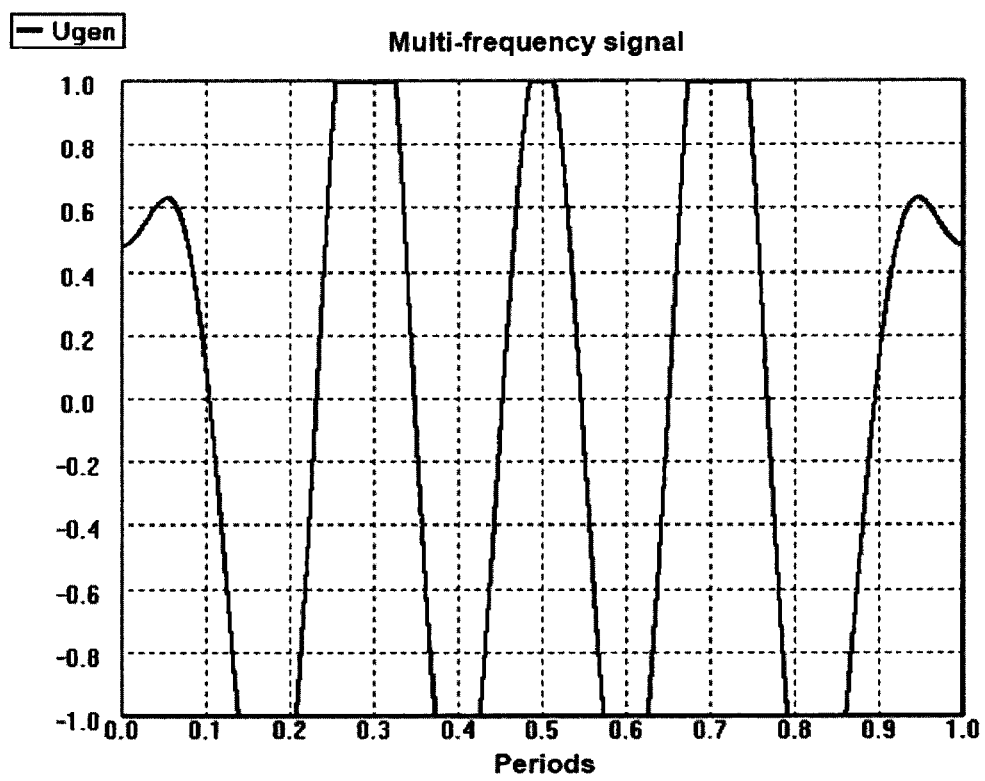
FIG. 4a, 4b shows an overmodulated multi-frequency signal with a spectrum.
Figure 4B:
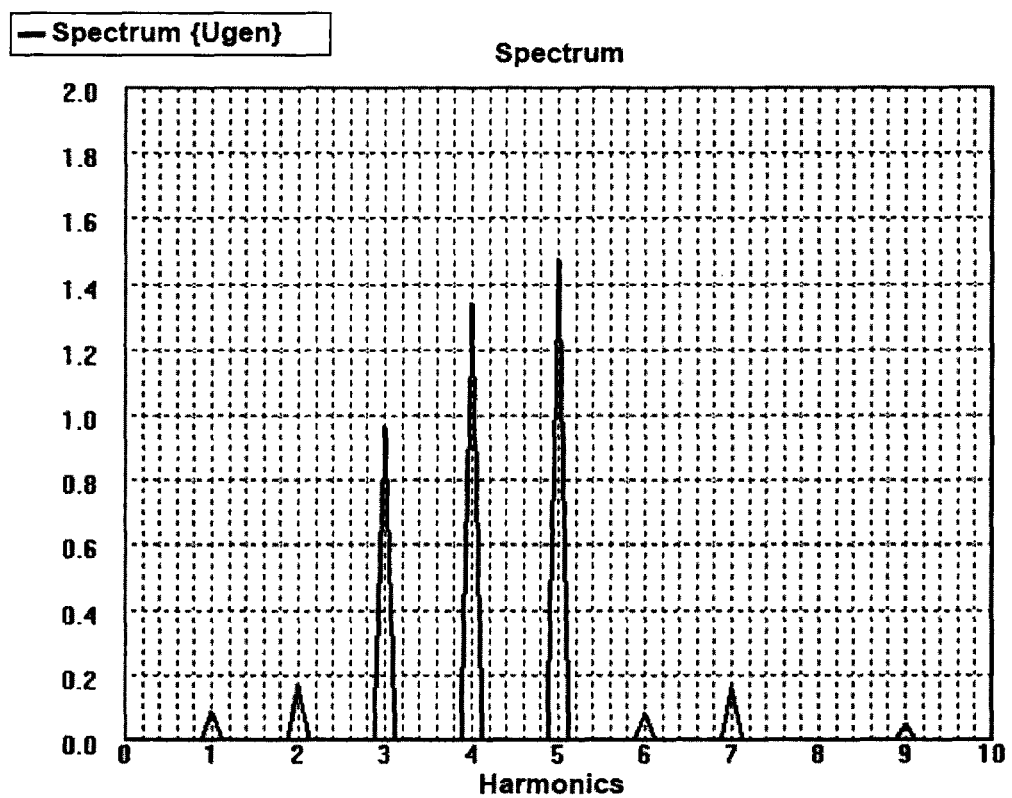

In FIGS. 4a and 4b, the multi-frequency signal of FIGS. 3a and 3b is illustrated with an overmodulation. In FIG. 4b, compared to FIG. 3b (without overmodulation), the increase of the power of the harmonics can be seen. As a result of the overmodulation, weak levels, too, occur at the points of the $1^{st}$, $2^{nd}$, $6^{th}$ and $7^{th}$ harmonic.

Figure 5A:
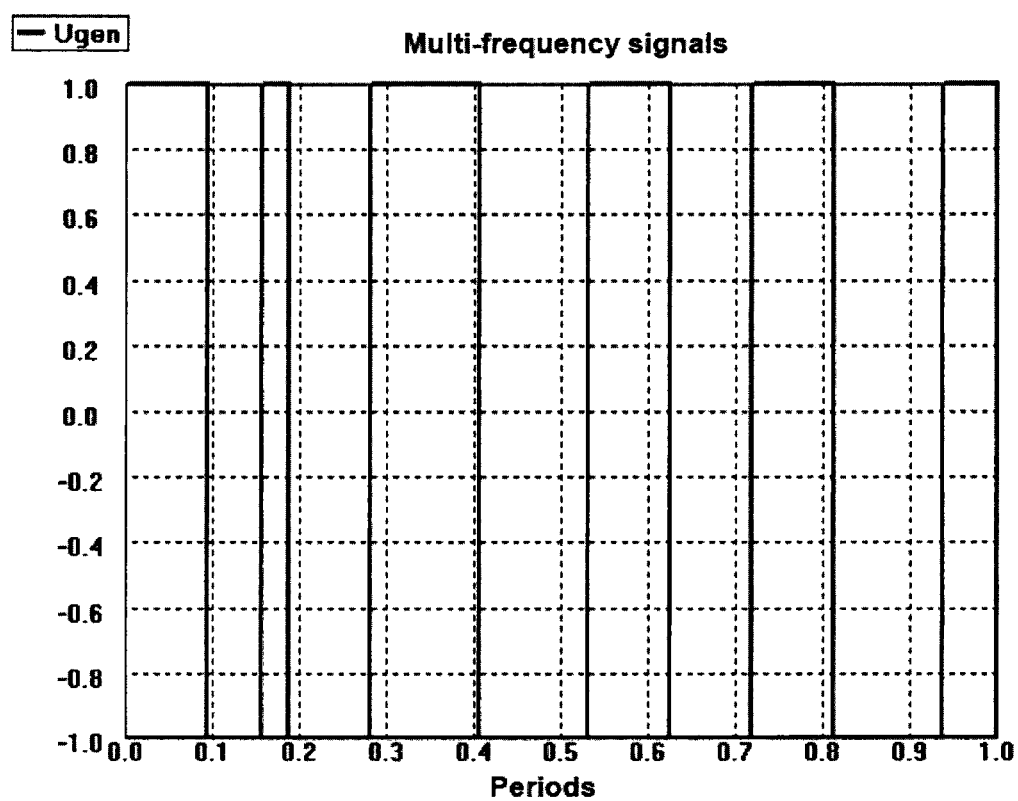
FIG. 5a, 5b shows a rectangular multi-frequency signal after binary optimization with a spectrum.
Figure 5B:
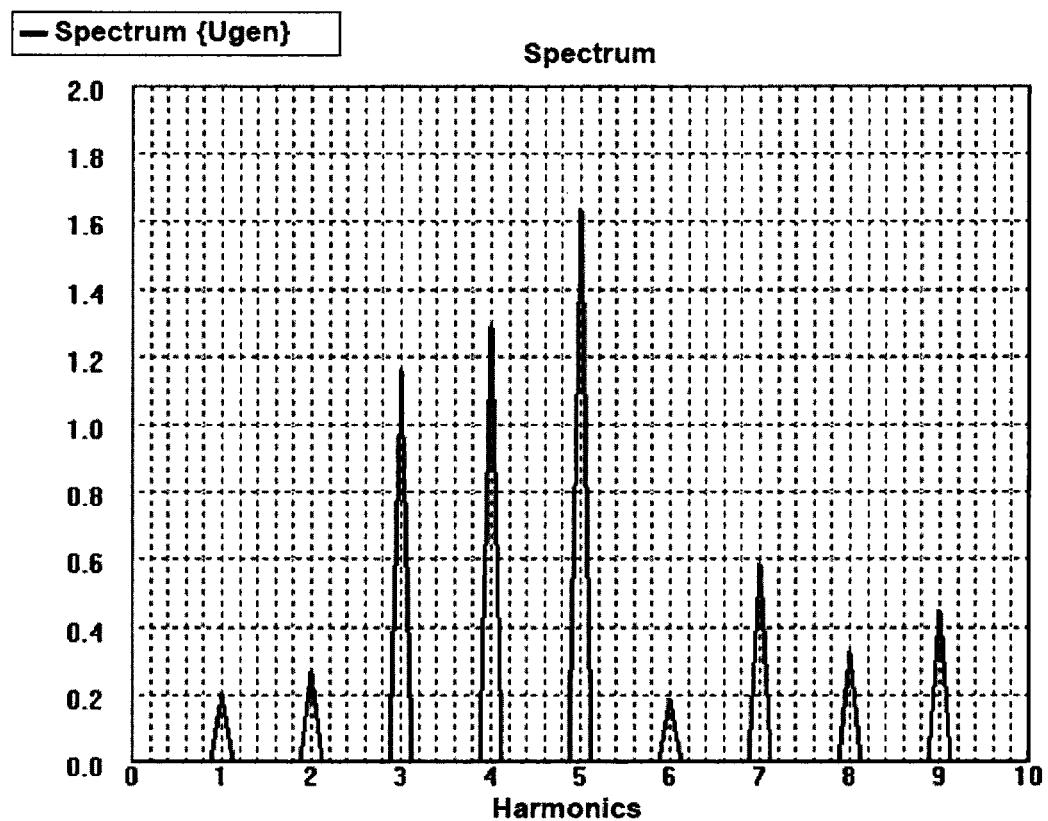

FIGS. 5a and 5b show a square pulse sequence with the associated spectrum which was specifically generated from a binary sequence optimization so as to maximize the power of the $3^{rd}$, $4^{th}$ and $5^{th}$ harmonic. Additionally, the marginal condition was set that the discrete spectrum (for the desired harmonics) rise monotonically within a parameter similar to equation (6), as it can be taken clearly from FIG. 5b. Here, the fact that a square pulse sequence naturally has a spectral envelope curve dropping by 1/f was not exploited. Instead, the focus lies on the targeted generation of selected harmonics and on adjusting the power of said harmonics so as to construct a measuring signal that has a high interference resistance.

Figure 6A:
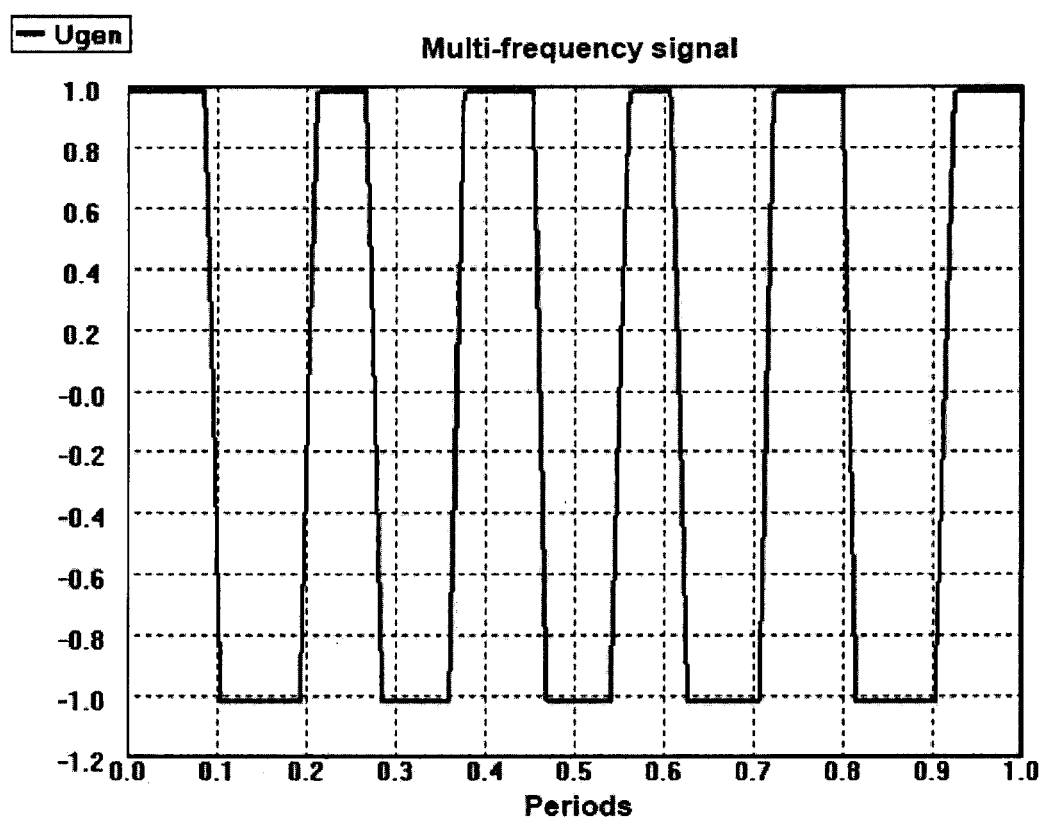
FIG. 6a, 6b shows a trapezoidal multi-frequency signal with a spectrum.
Figure 6B:
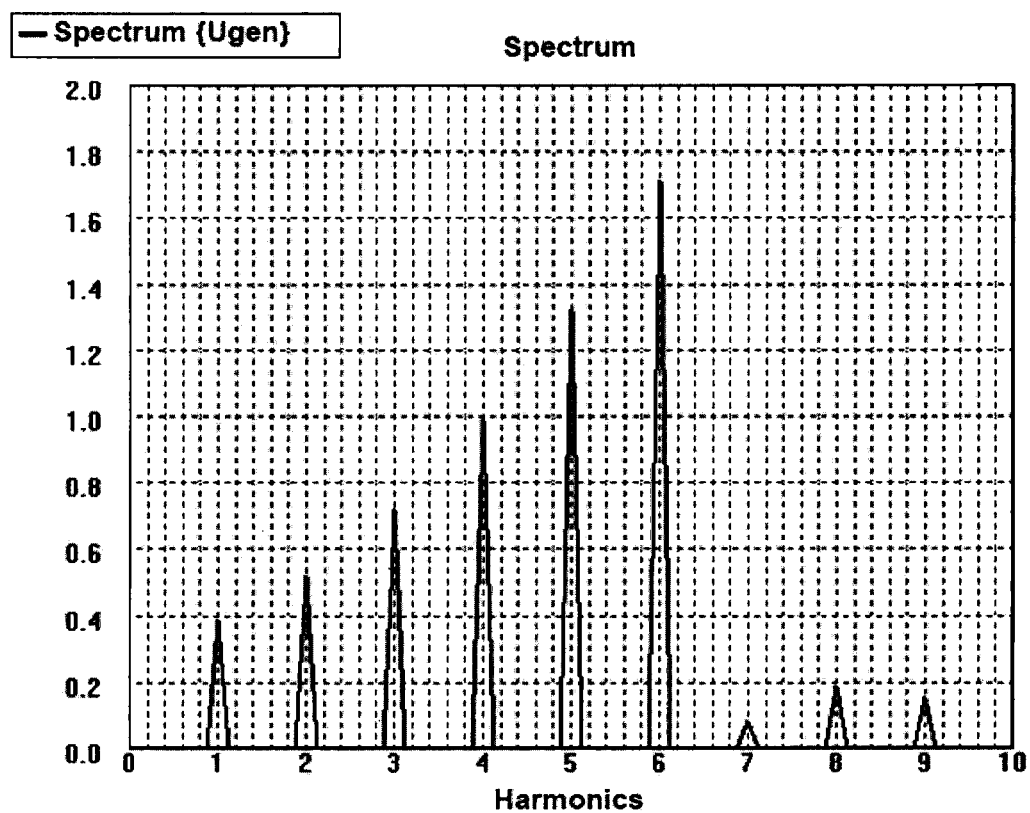

In FIGS. 6a and 6b, a trapezoidal multi-frequency signal with the associated spectrum can be seen, which has arisen from the reworking of a binary sequence-optimized square pulse sequence by inserting linearly interpolating nodes. The trapezoidal pulse sequence was determined with the aim of generating six selected, usable harmonics of the orders 1 to 6 and has, as can be seen in FIG. 6b, only weakly pronounced higher harmonics.

Figure 7:
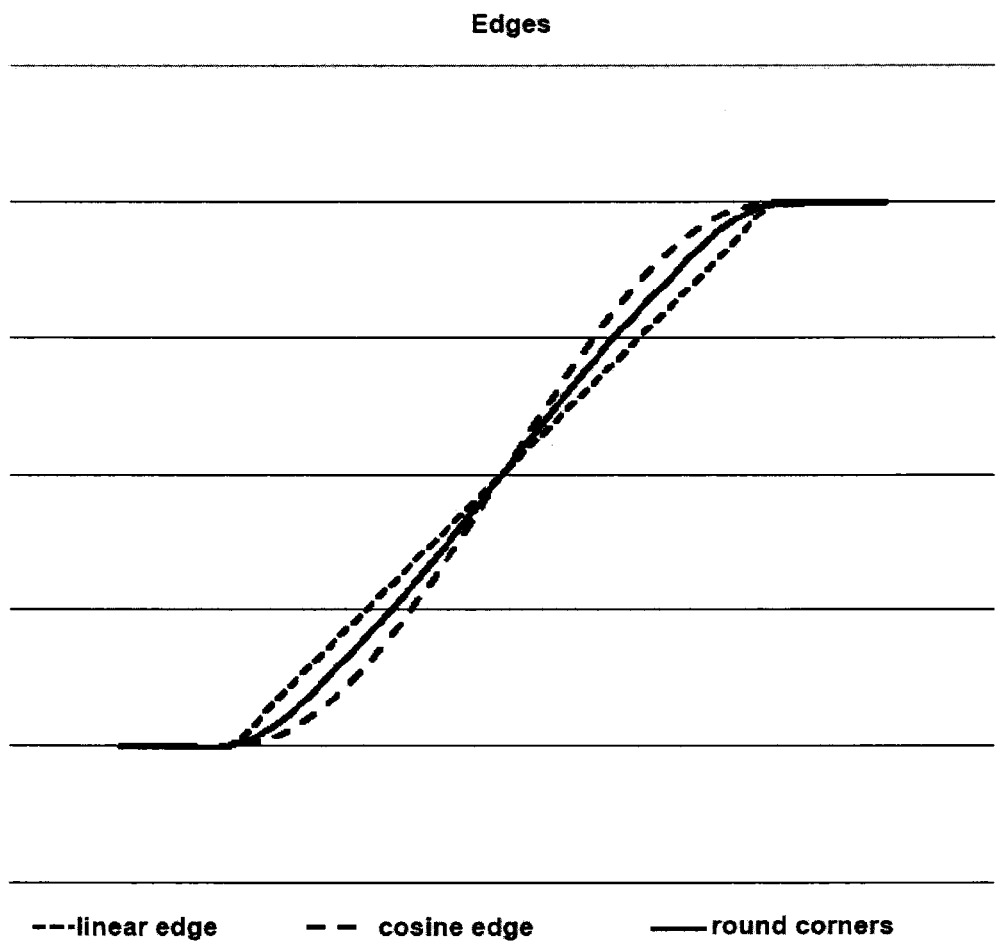
FIG. 7 shows edge shapes of modified square pulses ($U_{gen}$) with a measuring signal ($U_a$)

FIG. 7 shows examples of different edge shapes of modified, post-processed square pulses, with which spectral parameters can be fulfilled, for example with regard to the required bandwidth. A linear edge (line of short dashes), a cosine edge (line of long dashes) and a largely linearly running edge with rounded transitions to constant portions (continuous line) are illustrated.

Figure 8:
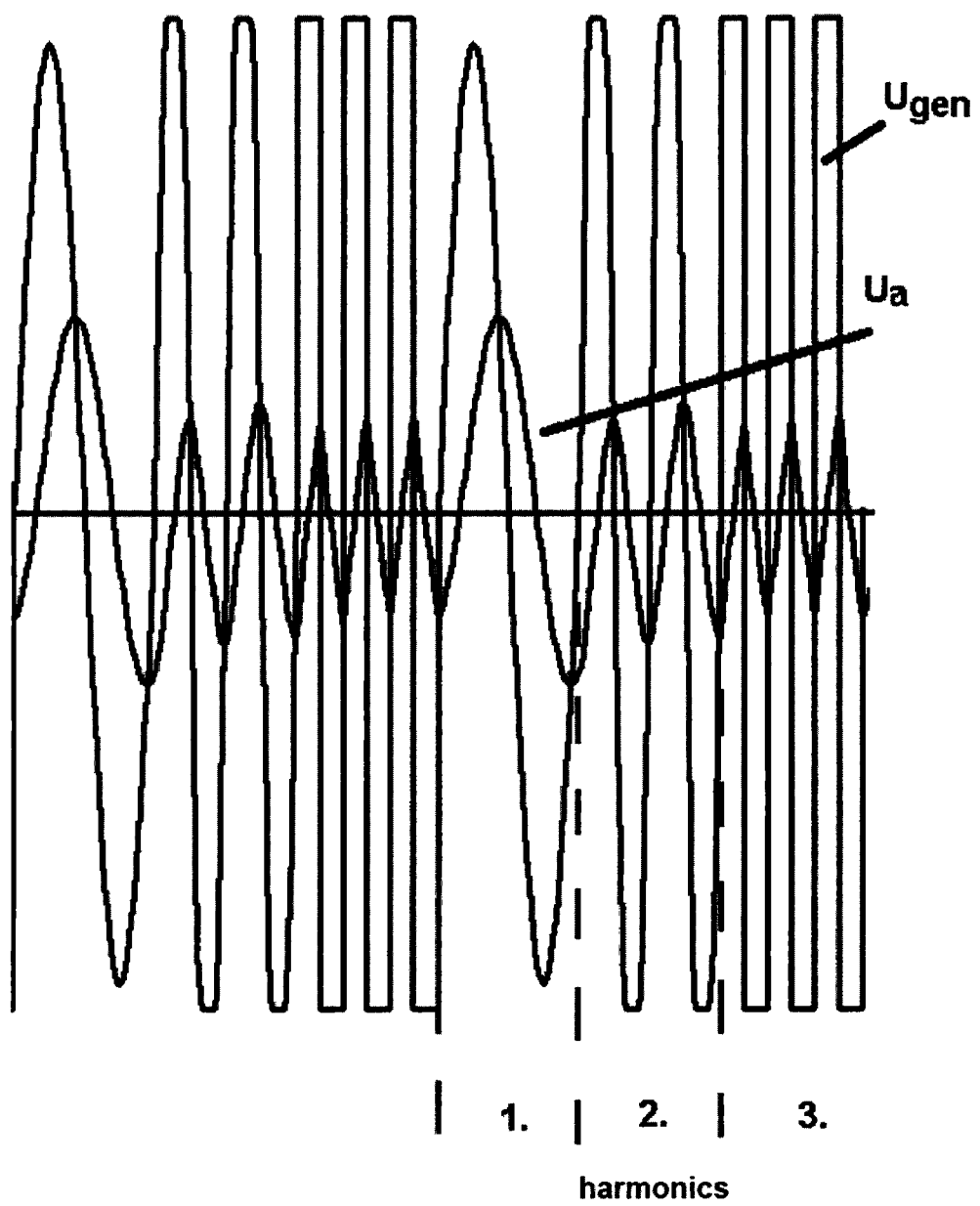
FIG. 8 shows a multi-frequency signal composed according to the time-division multiplexing method.

FIG. 8 shows an example of the measuring signal $U_{gen}$ with a large amplitude, in which the $1^{st}$, $2^{nd}$ and $3^{rd}$ harmonic of the fundamental frequency $f_{gen}$ were generated one after the other by means of the time-division multiplexing method. The repetitive period of the resulting measuring signal corresponds to the sum of the lengths of the three signal portions of equal length (signal generator periods $T_{gen}$) in which the corresponding harmonics are generated, respectively. In the case of equally long signal portions, there is only a limited possibility of making the amplitudes (modulation) of the individual harmonics rise with the frequency. However, it can be seen that the $1^{st}$ harmonic is slightly undermodulated, the $2^{nd}$ harmonic is slightly overmodulated (slight limitation) and the $3^{rd}$ harmonic is strongly overmodulated (square shape).

Figure 9:
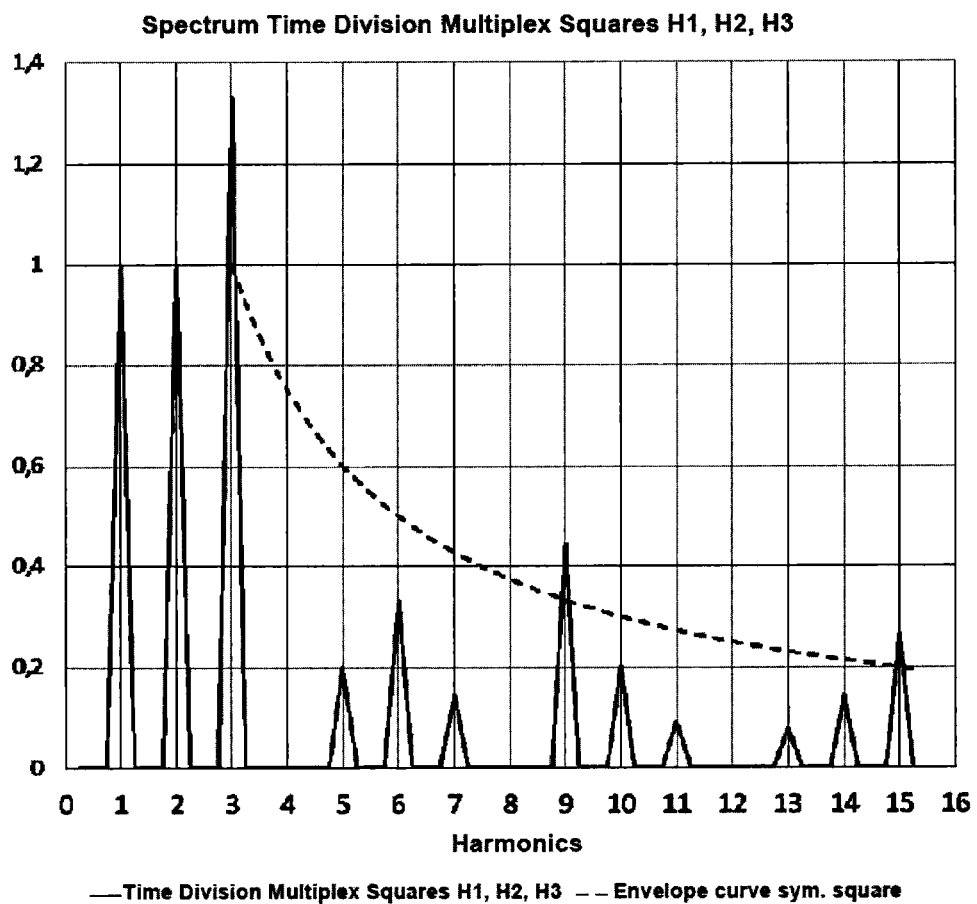
FIG. 9 shows a spectrum of a multi-frequency signal composed according to the time-division multiplexing method.

The sine signals in the signal portions can also be replaced with square signals. For instance, in FIG. 9, a spectrum of a multi-frequency signal composed according to the time-division multiplexing method is illustrated, which results from the integration time over three equally long signal portions (signal generator periods $T_{gen}$), wherein in the individual signal portions, square signals were generated one after the other whose respective fundamental frequency corresponds to the respective frequency of the harmonics of $1^{st}$, $2^{nd}$ and $3^{rd}$ order. The repetitive frequency is $1/(3T_{gen})$. It can be seen that in this construction of the multi-frequency signal, the amplitude distribution based on the third harmonic extends beyond the envelope curve of the Fourier coefficient distribution according to a mathematical decomposition. In the case laid out here, the intentionally generated third harmonic profits from the first harmonic because the square oscillation based on the first harmonic per se contributes to the amplitude of the third harmonic.

Figure 10:
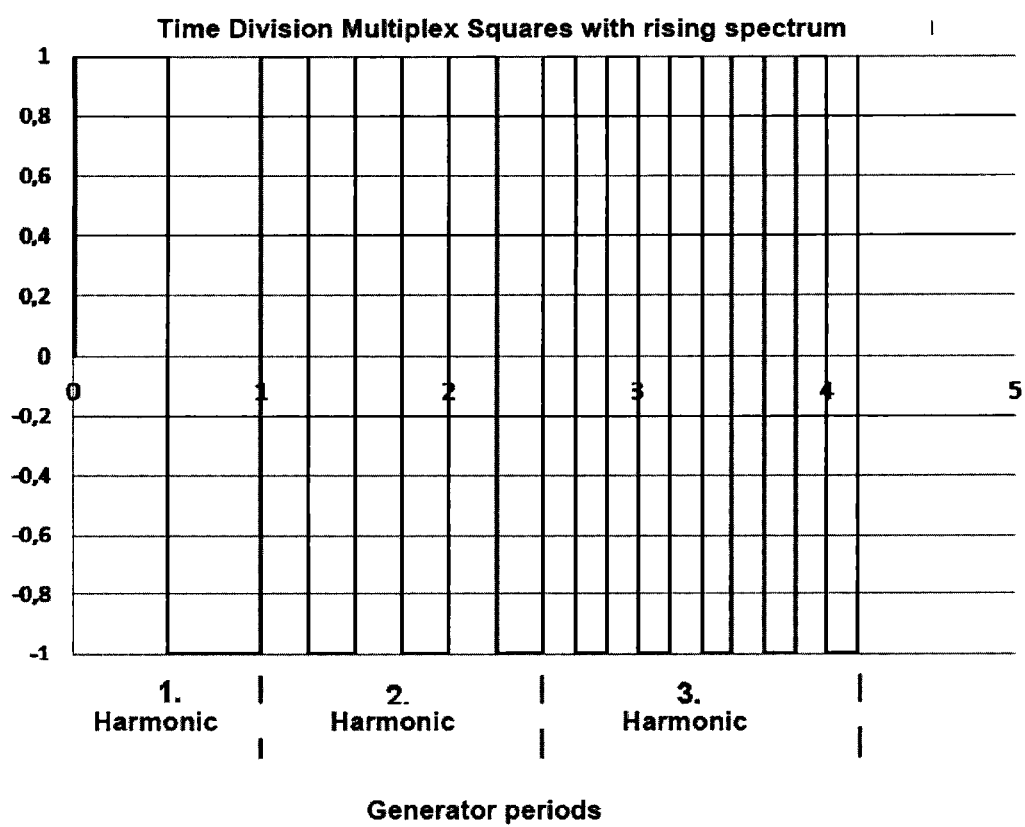
FIG. 10 shows a multi-frequency signal with signal portions of different lengths, composed according to the time-division multiplexing method.

More design options are offered by a multi-frequency signal that is composed according to the time-division multiplexing method and has signal portions of different length, which is illustrated in FIG. 10. In this case, an adjustment of the relative amplitudes of the harmonics to each other takes place by means of a weighting in such a manner that the individual signal portions have different lengths. In the first signal portion of the length $T_{gen}$, a square oscillation of the (frequency of the) first harmonic is generated, followed by a signal portion of the length $3/2\ T_{gen}$ with the generation of three square oscillations of the (frequency of the) second harmonic, followed by a signal portion of the length $5/3\ T_{gen}$ with the generation of five square oscillations of the (frequency of) the third harmonic. The repetitive period thus is $1+3/2+5/3=4.166$ signal generator periods $T_{gen}$.

Figure 11:
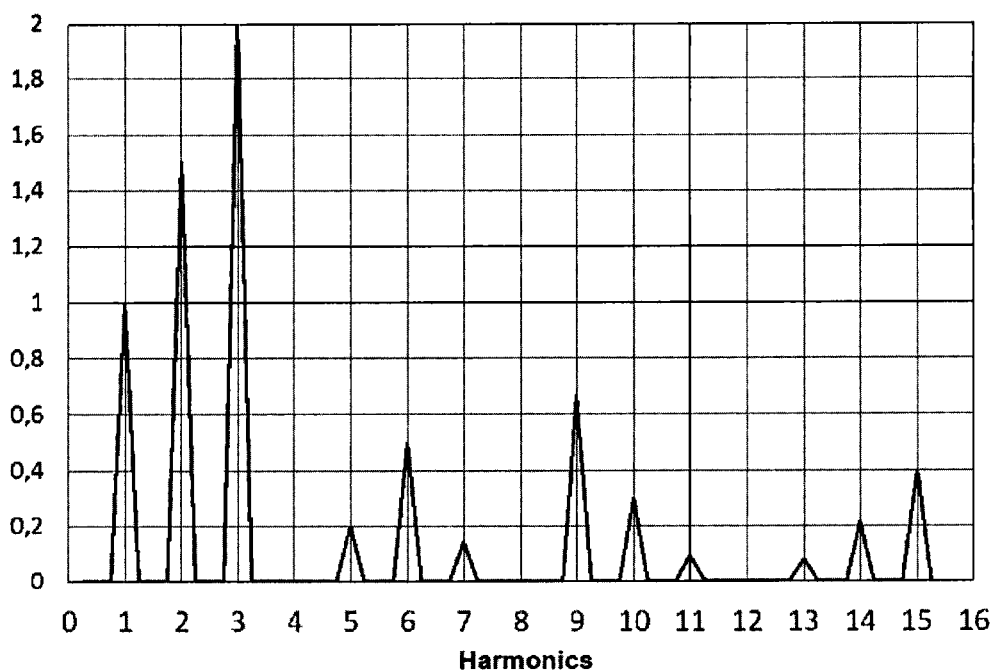
FIG. 11 shows the spectrum of the signal according to FIG. 10.

FIG. 11 shows the associated spectrum. Due to the different lengths of the signal portions, amplitude ratios of 1:3/2:5/3 should be expected between the first three harmonics. However, since the square oscillations based on the first harmonic already contribute to the third harmonic, a ratio of 1:3/2:2 can be taken from FIG. 11, i.e. a desired course rising linearly over the frequency, having the gradient $b=0.5$ in equation (6).

The invention claimed is:

1. A method for monitoring and measuring an insulation resistance in ungrounded and grounded power supply systems, said method comprising the method steps of:
generating a periodic measuring signal with increased interference resistance against interference signals, wherein the measuring signal is constructed as a multi-frequency signal using a square pulse sequence, a square pulse that forms the sequence being divided into m portions of equal length, each of the m portions being binarily set, in an ordered manner, either in a unipolar manner to 0/1 or in a bipolar manner to −1/+1, Fourier coefficients for selected harmonics being calculated for each of the 2m possible square pulse sequences, the square pulse sequence being selected that fulfils the predefined requirements regarding a spectral composition of the square pulse sequence;
coupling in the measuring signal between active conductors of a power supply system to be measured and ground; and
detecting and evaluating measured values of the measuring signal by registering said measured values of the measured signal by a measuring device configured to monitor the insulation resistance of the power supply system.

2. The method according to claim 1, in which power of selected harmonics becomes maximal in a predefined dynamic range.

3. The method according to claim 1, in which low harmonics of a fundamental frequency are suppressed.

4. The method according to claim 1, in which amplitudes of the harmonics rise monotonically with the frequency.

5. The method according to claim 1, in which amplitudes of the harmonics rise linearly with the frequency.

6. The method according to claim 1, in which edges of the square pulse sequence are post-processed by inserting interpolating nodes, resulting in a signal form that deviates from the square pulse.

7. The method according to claim 6, in which linearly interpolating nodes, trapezoidal pulse sequences are generated.

8. The method according to claim 6, in which the interpolating nodes, pulses with cosine edges or with largely linearly running edges and rounded transitions to constant portions are generated.

9. A method for monitoring and measuring an insulation resistance in ungrounded and grounded power supply systems, said method comprising the method steps of:
- generating a periodic measuring signal with increased interference resistance against interference signals;
- coupling in the measuring signal between active conductors of a power supply system to be monitored and ground; and
- detecting and evaluating measured values of the measuring signal by registering said measured values of the measured signal by a measuring device allowing to monitor the insulation resistance of power supply systems, wherein the measuring signal is formed as a multi-frequency signal comprising time-division multiplexed harmonics of different orders of an orthogonal function system being arranged in signal portions over a measuring signal period thus allowing a targeted spectral composition of the multi-frequency signal.

10. The method according to claim 9, in which the functions are sinusoidal functions and their harmonics.

11. The method according to claim 10, in which for increasing a root mean square of higher harmonics, an overmodulation and/or a limitation of the signal portions takes place.

12. The method according to claim 9, in which the functions are square functions, Walsh functions, trapezoidal functions or functions with cosine edges.

13. The method according to claim 12, in which the trapezoidal functions have largely linearly running edges and rounded transitions to constant portions.

14. The method according to claim 9, in which the signal portions have the same length.

15. The method according to claim 9, in which a weighting of the functions takes place by means of differently long signal portions.

16. A signal generator for monitoring an insulation resistance in ungrounded and grounded power supply systems, said signal generator comprising:
- a signal generator circuit generating a periodic multi-frequency measuring signal; and
- a coupling circuit coupling in the measuring signal between active conductors of a power supply system to be monitored and ground, wherein the signal generator circuit generates the multi-frequency measuring signals by performing at least one of the following steps:

1) forming the multi-frequency measuring signal using a square pulse sequence, a square pulse that forms the sequence being divided into m portions of equal length, each of the m portions being binarily set, in an ordered manner, either in a unipolar manner to 0/1 or in a bipolar manner to −1/+1, Fourier coefficients for selected harmonics being calculated for each of the $2^m$ possible square pulse sequences, the square pulse sequence being selected that fulfils the predefined requirements regarding a spectral composition of the square pulse sequence, and 2) forming the multi-frequency measuring signal using time-division multiplexed harmonics of different orders of an orthogonal function system being arranged in signal portions over the measuring signal period thus allowing a targeted spectral composition of the multi-frequency signal.

* * * * *

UNITED STATES PATENT AND TRADEMARK OFFICE
CERTIFICATE OF CORRECTION

PATENT NO. : 9,632,131 B2  
APPLICATION NO. : 14/038914  
DATED : April 25, 2017  
INVENTOR(S) : Eckhard Broeckmann et al.

Page 1 of 1

It is certified that error appears in the above-identified patent and that said Letters Patent is hereby corrected as shown below:

In the Specification

Column 2, Line 51:
"connection with the preamble of claim 1 in that the"

Should be:
--connection with the steps of generating a periodic measuring signal, coupling in the measuring signal between active conductors of a power supply system to be monitored and earth, and detecting and evaluating measured values of the measuring signal, wherein the--

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*